(12) United States Patent
Mi et al.

(10) Patent No.: US 11,151,918 B2
(45) Date of Patent: Oct. 19, 2021

(54) SHIFT REGISTER, GATE LINE DRIVING METHOD, ARRAY SUBSTRATE, AND DISPLAY APPARATUS

(71) Applicants: BOE Technology Group Co., Ltd., Beijing (CN); Beijing BOE Optoelectronics Technology Co., Ltd., Beijing (CN)

(72) Inventors: Lei Mi, Beijing (CN); Shijun Wang, Beijing (CN); Yanna Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 298 days.

(21) Appl. No.: 15/773,688

(22) PCT Filed: Sep. 20, 2017

(86) PCT No.: PCT/CN2017/102424
§ 371 (c)(1),
(2) Date: May 4, 2018

(87) PCT Pub. No.: WO2018/149130
PCT Pub. Date: Aug. 23, 2018

(65) Prior Publication Data
US 2019/0066560 A1     Feb. 28, 2019

(30) Foreign Application Priority Data
Feb. 17, 2017    (CN) .......................... 201710086627.7

(51) Int. Cl.
*G11C 19/00*     (2006.01)
*G09G 3/20*      (2006.01)
*G11C 19/28*     (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
None
See application file for complete search history.

(56) References Cited

U.S. PATENT DOCUMENTS 10,210,789 B2    2/2019  Li et al.
10,255,869 B2 *  4/2019  Li .......................... G11C 19/18
(Continued)

FOREIGN PATENT DOCUMENTS

CN    202210402 U    5/2012
CN    104464667 A    3/2015
(Continued)

OTHER PUBLICATIONS

First Office Action, including Search Report, for Chinese Patent Application No. 201710086627.7, dated Feb. 27, 2019, 22 pages.
(Continued)

*Primary Examiner* — Tuan T Lam
(74) *Attorney, Agent, or Firm* — Westman, Champlin & Koehler, P.A.

(57) ABSTRACT

The present disclosure discloses a shift register, a gate line driving method, an array substrate, and a display apparatus, and belongs to the field of displays. The shift register comprises a plurality of shift register units each connected to a group of gate lines on an array substrate, wherein different shift register units are connected to different groups of gate lines, and each group of gate lines comprises at least two gate lines; and a control unit configured to control turn-on and turn-off of the gate lines, wherein the control unit is further configured to control various gate lines in a high resolution region to be turned on and turned off line by line,
(Continued)

and control at least two adjacent gate lines in a low resolution region to be turned on and turned off synchronously.

15 Claims, 4 Drawing Sheets

(52) U.S. Cl.
CPC .............. *G09G 2310/021* (2013.01); *G09G 2310/0205* (2013.01); *G09G 2310/0213* (2013.01); *G09G 2310/0267* (2013.01); *G09G 2310/0286* (2013.01); *G09G 2310/08* (2013.01); *G09G 2330/021* (2013.01); *G09G 2340/0407* (2013.01)

(56) References Cited

U.S. PATENT DOCUMENTS

| | | | |
|---|---|---|---|
| 2012/0056909 A1 | 3/2012 | Shih et al. | |
| 2014/0159997 A1* | 6/2014 | Chen | G09G 3/3611 345/87 |
| 2015/0221273 A1 | 8/2015 | Lee et al. | |
| 2015/0325181 A1* | 11/2015 | Wang | G09G 3/3677 377/64 |
| 2016/0012764 A1* | 1/2016 | Xu | G11C 19/28 345/204 |
| 2016/0027526 A1* | 1/2016 | Xu | G11C 19/28 345/215 |
| 2016/0240158 A1* | 8/2016 | Xu | G11C 19/28 |
| 2016/0267713 A1 | 9/2016 | Patel | |
| 2016/0267716 A1 | 9/2016 | Patel | |
| 2016/0358666 A1* | 12/2016 | Pang | G11C 19/287 |
| 2017/0039968 A1* | 2/2017 | Chen | G09G 3/3648 |
| 2017/0148420 A1 | 5/2017 | Gao et al. | |
| 2017/0178557 A1 | 6/2017 | Li et al. | |
| 2017/0178558 A1* | 6/2017 | Zhou | G09G 3/20 |
| 2017/0178581 A1* | 6/2017 | Li | G11C 19/28 |
| 2017/0178582 A1* | 6/2017 | Li | G09G 3/3607 |
| 2017/0200415 A1 | 7/2017 | Noguchi et al. | |
| 2018/0211717 A1* | 7/2018 | Feng | G09G 3/3677 |
| 2020/0234621 A1* | 7/2020 | Mi | G11C 19/287 |

FOREIGN PATENT DOCUMENTS

| | | |
|---|---|---|
| CN | 104700798 A | 6/2015 |
| CN | 104978944 A | 10/2015 |
| CN | 104992686 A | 10/2015 |
| CN | 105139792 A | 12/2015 |
| CN | 106157873 A | 11/2016 |
| CN | 106710508 A | 5/2017 |
| WO | 2016009909 A1 | 1/2016 |

OTHER PUBLICATIONS

Office Action, including Search Report, for Chinese Patent Application No. 201710086627.7, dated Oct. 23, 2019, 21 pages.
English translation of International Search Report and English translation of Box V of Written Opinion, for International Application No. PCT/CN2017/102424, dated Dec. 27, 2017, 7 pages.

* cited by examiner

SHIFT REGISTER, GATE LINE DRIVING
METHOD, ARRAY SUBSTRATE, AND
DISPLAY APPARATUS

CROSS-REFERENCE TO RELATED
APPLICATION(S)

This application is a Section 371 National Stage application of International Application No. PCT/CN2017/102424, filed on 20 Sep. 2017, which has not yet published, and claims priority to Chinese Patent Application No. 201710086627.7, filed on Feb. 17, 2017, which are incorporated herein by reference in their entirety.

TECHNICAL FIELD

The present disclosure relates to the field of displays, and more particularly, to a shift register, a gate line driving method, an array substrate, and a display apparatus.

BACKGROUND

When a display panel displays an image, it needs to use a shift register (i.e., a gate driving circuit) to scan pixel units. The shift register comprises a plurality of shift register units. Each of the shift register units corresponds to a row of pixel units. The plurality of shift register units implement a progressive scanning and driving for various rows of pixel units in the display panel to display the image.

With the increase of the resolution of the display panel, a number of rows of pixel units in the display panel is also increasing. For example, a number of rows of pixel units in a 4K display panel is 2160, and a number of rows of pixel units in a 8K display panel is up to 4320. As the number of rows of pixel units in the display panel increases, power consumption of the display panel increases rapidly when the display panel is scanned progressively. The power consumption is undoubtedly the first problem to be solved for a high resolution display panel.

SUMMARY

In a first aspect, the embodiments of the present disclosure provide a shift register. The shift register comprises a plurality of shift register units each connected to a group of gate lines on an array substrate. Different shift register units are connected to different groups of gate lines, and each group of gate lines comprises at least two gate lines. The shift register further comprises a control unit configured to control turn-on and turn-off of the gate lines. The control unit is further configured to control various gate lines in a high resolution region to be turned on and turned off line by line, and control at least two adjacent gate lines in a low resolution region to be turned on and turned off synchronously.

In an implementation of the embodiments of the present disclosure, the control unit comprises: a plurality of control switches which are in a one-to-one correspondence with the gate lines on the array substrate, wherein each of the control switches is connected between a corresponding gate line and a corresponding shift register unit. The control unit further comprises a controller configured to control turn-on and turn-off of the plurality of control switches and output of the plurality of shift register units.

In another implementation of the embodiments of the present disclosure, all the gate lines in each group of gate lines are provided consecutively in a scanning order, or all the gate lines in each group of gate lines are not provided consecutively in the scanning order.

In another implementation of the embodiments of the present disclosure, when all the gate lines in each group of gate lines are provided consecutively in the scanning order, the controller is configured to control the control switches connected to each group of gate lines in the high resolution region to be turned on and turned off in turn, and control the control switches connected to each group of gate lines in the low resolution region to be turned on and turned off simultaneously.

In another implementation of the embodiments of the present disclosure, the controller is further configured to control the plurality of shift register units to output a signal in turn in a scanning order of signal lines.

In another implementation of the embodiments of the present disclosure, when all the gate lines in each group of gate lines are not provided consecutively in the scanning order, the controller is configured to control various gate lines in the high resolution region to be turned on and turned off in turn in the scanning order and control the control switches connected to at least two gate lines in the low resolution region which are provided consecutively in the scanning order to be turned on and turned off simultaneously.

In another implementation of the embodiments of the present disclosure, the controller is further configured to control, in the high resolution region, shift register units connected to various gate lines in the high resolution region to output a signal in turn; and control, in the low resolution region, shift register units connected to gate lines which are turned on and turned off synchronously to output a signal at the same time.

In another implementation of the embodiments of the present disclosure, the plurality of control switches are divided into N groups, and any two of consecutive N gate lines are connected to control switches belonging to different groups; and each group of control switches is connected to a control line to receive an input signal from the controller, where N is a positive integer greater than 1.

In another implementation of the embodiments of the present disclosure, the control unit is configured to control, in the low resolution region, every two or three consecutive gate lines to be turned on and turned off synchronously.

In another implementation of the embodiments of the present disclosure, the plurality of shift register units comprise a plurality of first shift register units and a plurality of second shift register units, wherein the first shift register units and the second shift register units are arranged on opposing sides of a display area.

In a second aspect, the embodiments of the present disclosure further provide a gate line driving method performed by the shift register described in any of the embodiments described above. The method comprises: receiving a driving signal indicating a high resolution region and a low resolution region; and controlling, based on the driving signal, various gate lines in the high resolution region to be turned on and turned off line by line and controlling at least two adjacent gate lines in the low resolution region to be turned on and turned off synchronously.

In a third aspect, the embodiments of the present disclosure further provide an array substrate, comprising the shift register described in any of the embodiments described above.

In a fourth aspect, the embodiments of the present disclosure further provide a display apparatus comprising the array substrate described in the third aspect.

BRIEF DESCRIPTION OF THE DRAWINGS

In order to more clearly explain the technical solutions in the embodiments of the present disclosure, the accompanying drawings needed to be used in the description of the embodiments will be briefly described below. Obviously, the accompanying drawings in the following description are merely some embodiments of the present disclosure. For those of ordinary skill in the art, other accompanying drawings may also be obtained based on these accompanying drawings without any creative work.

DETAILED DESCRIPTION

Figure 1:
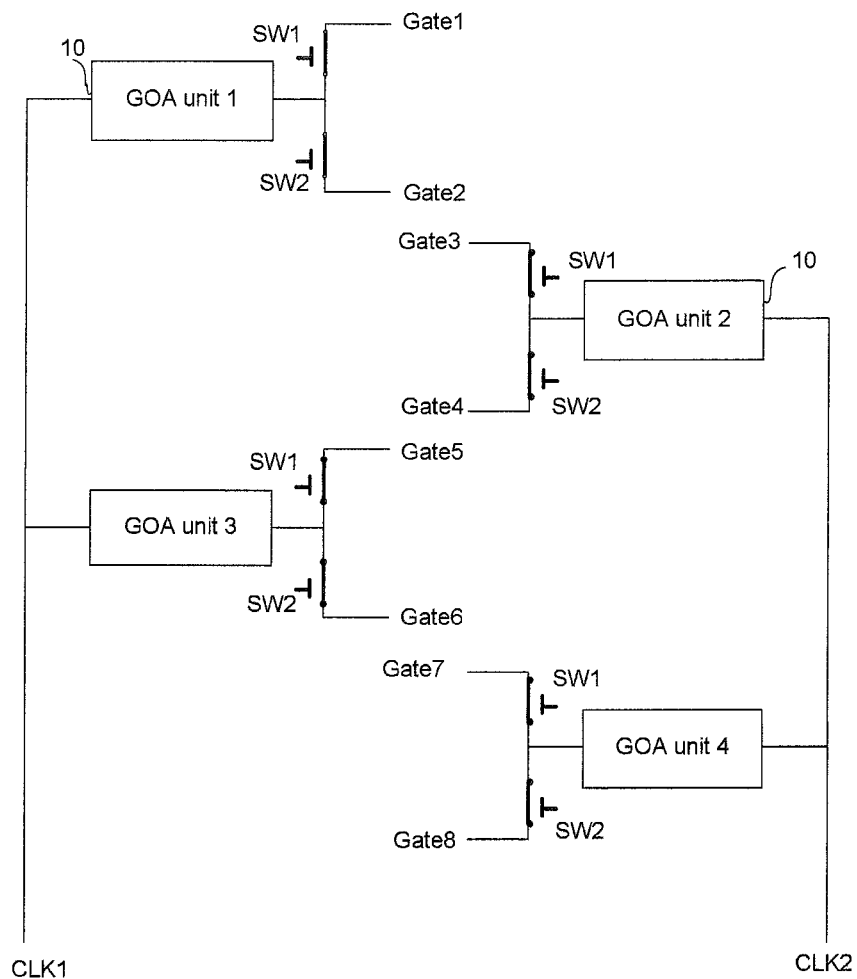
FIG. 1 is a structural diagram of a shift register according to an embodiment of the present disclosure.

In order to make the purposes, technical solutions, and advantages of the present disclosure more clear, the embodiments of the present disclosure will be further described in detail below with reference to the accompanying drawings.

The embodiments of the present disclosure provide a shift register comprising a control unit and a plurality of shift register units. Each of the shift register units is connected to a group of gate lines on an array substrate, wherein different shift register units are connected to different groups of gate lines, and each group of gate lines comprises at least two gate lines. The control unit is configured to control signals output by various shift register units to respective gate lines to control turn-on and turn-off of each row of gate lines, so that a display area has at least one of a high resolution region and a low resolution region. The control unit is further configured to control various gate lines in the high resolution region to be turned on and turned off line by line, and control at least two adjacent gate lines in the low resolution region to be turned on and turned off synchronously.

Turn-on of a gate line refers to that a high level of a gate is output to a Thin Film Transistor (TFT for short) of a pixel unit through a gate line, to control a source and a drain of the TFT to be in a turn-on state. Turn-off of a gate line refers to that a low level of a gate is output to a TFT of a pixel unit through a gate line, to control a source and a drain of the TFT to be in a turn-off state.

In the embodiments of the present disclosure, gate lines are controlled to be turned on and turned off line by line in the high resolution region; and at least two adjacent gate lines are controlled to be turned on and turned off synchronously in the low resolution region. In this way, various gate lines in the high resolution region work independently to ensure a high resolution, and at least two gate lines are scanned at the same time in the low resolution region and the same data signal is written to the at least two gate lines by a source driver, which reduces a variation in the gate signal and reduces power consumption of the source driver. Finally, a high resolution display panel may be divided into the high resolution region and the low resolution region, and the overall power consumption of the display panel is reduced through the lower power consumption of the low resolution region, which solves the problem of a drastically increased power consumption of a conventional high resolution display panel due to an increased number of rows to be scanned.

In a possible implementation, the control unit may comprise a controller and a plurality of control switches. Each of the gate lines is connected to a corresponding shift register unit through a control switch. The controller is configured to control turn-on and turn-off of the plurality of control switches and control output of the plurality of shift register units, so as to control turn-on and turn-off of various rows of gate lines.

In this implementation, switching control of various rows of gate lines is realized by designing the control switches, which is simple and convenient.

Further, the controller is configured to output a clock (CLK) signal to each shift register unit to control output of the shift register unit. Specifically, the controller may provide one, two or more clock signals, wherein one signal is input to a plurality of shift register units at the same time.

In the embodiments of the present disclosure, a group of gate lines may comprise two or three gate lines. The control unit is configured to control every two or three consecutive gate lines to be turned on and turned off synchronously in the low resolution region. Two or three gate lines are scanned at the same time, which can not only ensure an effective reduction in the resolution, but also does not cause the resolution of the low resolution region to be too low.

In the embodiments of the present disclosure, the control switches may be TFT switches, and may be manufactured when the display panel is manufactured, which is convenient.

In the embodiments of the present disclosure, the display panel may have two display modes, which are a first display mode and a second display mode respectively. When the display panel uses the first display mode (which may also be referred to as a low power display mode), the display area comprises low resolution regions. For example, the display area may be divided into a low resolution region, a high resolution region and a low resolution region which are provided along a scanning direction of data lines. A size and a position of each region may specifically be determined using human eye tracking technology. For example, a region which is being viewed by a user is determined as a high resolution region, and the remaining regions are set as low resolution regions.

When the display panel uses a second display mode (which may also be referred to as a normal mode), the entire display area is a high resolution region. In the second display mode, various rows of gate lines in the display area are turned on in turn.

In an implementation of the embodiments of the present disclosure, all the gate lines in each group of gate lines are consecutively arranged adjacent to each other in a scanning order. As shown in FIG. 1, each group of gate lines comprises two gate lines (for example, Gate1 and Gate2), and the two gate lines are arranged adjacent to each other in the scanning order. The two gate lines are connected to a Gate On Array (GOA for short) unit 10 (i.e., a shift register unit) through two control switches (which are SW1 and SW2). The controller provides two clock signals, i.e., CLK1 and CLK2, wherein CLK1 is output to a GOA unit 1 and a GOA unit 3, and CLK2 is output to a GOA unit 2 and a GOA unit 4. Of course, the two CLKs described above are only used by way of example. In practical applications, there may also be more or less CLKs, for example, 4 CLKs. In addition, the GOA unit further needs to use Start Vertical (STV) as a start signal to start scanning. Subsequent GOA units use an output of a previous GOA unit as an input to control their own outputs, which may specifically be implemented in a cascade manner.

In the embodiments of the present disclosure, the plurality of shift register units comprise a plurality of first shift register units and a plurality of second shift register units. The first shift register units and the second shift register units are arranged on opposing sides of the display area. Placing the plurality of shift register units on opposing sides of the display area prevents a border of the display panel from being too large due to arrangement of the plurality of shift register units on the same side. As shown in FIG. 1, the GOA unit 1 and the GOA unit 3 are first shift register units, and the GOA unit 2 and the GOA unit 4 are second shift register units.

Alternatively, in the embodiments of the present disclosure, the plurality of control switches are divided into N groups, and any two of consecutive N gate lines are connected to control switches belonging to different groups; and each group of control switches is connected to one control line to receive an input signal from the controller, where N is a positive integer greater than 1. The control switches are divided into groups and each group of control switches is connected to one control line to facilitate control and routing.

It should be illustrated that, when implemented, different groups of control switches may use completely different driving signals, or different groups of control switches may use the same driving signal. For example, two groups of control switches use the same driving signal.

Figure 2:
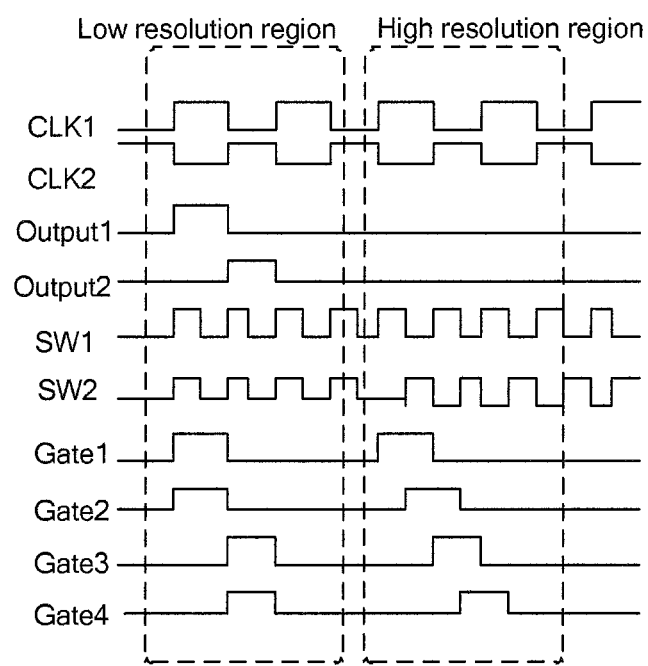
FIG. 2 is a timing control diagram according to an embodiment of the present disclosure.

As shown in FIG. 1, the control switches are divided into four groups, one of which is a plurality of control switches SW1 on the left side, one of which is a plurality of control switches SW2 on the left side, one of which is a plurality of control switches SW1 on the right side, and one of which is a plurality of control switches SW2 on the right side. In the four groups of control switches, the two groups of control switches SW1 use the same driving signal, and the two groups of control switches SW2 use the same driving signal, as shown in FIG. 2. If the GOA units in FIG. 1 are provided on one side, the control switches may also be divided into two groups, one of which is the control switches SW1, and the other of which is the control switches SW2.

In the embodiments of the present disclosure, an extension direction of the control lines is provided along the scanning direction of the data lines, which facilitates arrangement and connection of the control lines.

When all the gate lines in each group of gate lines are consecutively arranged adjacent to each other in the scanning order, the controller is configured to control, in the high resolution region, the control switches connected to the same shift register unit to be turned on and turned off in turn; and control, in the low resolution region, the control switches connected to the same shift register unit to be turned on and turned off simultaneously. In the high resolution region, the control switches connected to the same shift register unit are controlled to be turned on and turned off in turn, so that various rows of pixels are displayed differently to achieve a high resolution; and in the low resolution region, the control switches connected to the same shift register unit are controlled to be turned on and turned off simultaneously, so that at least two rows of pixels are displayed in the same manner to achieve a low resolution.

When all the gate lines in each group of gate lines are consecutively arranged adjacent to each other in the scanning order, the controller is further configured to control the plurality of shift register units to output a signal in turn according to the scanning direction of the signal lines. The plurality of shift register units are controlled to output a signal in turn according to the scanning direction, so that high and low resolutions can be realized under the control of the control switches.

An operation of the shift register shown in FIG. 1 will be described in detail below in conjunction with a signal timing diagram shown in FIG. 2.

As shown in FIG. 2, CLK1 and CLK2 are inverting signals. In the low resolution region and the high resolution region, a timing of CLK1 and CLK2 does not change. In the low resolution region, SW1 and SW2 are in-phase signals, i.e., positions of high and low levels are the same, and a period of SW1 is ½ of a period of the CLK signal. At this time, two gate lines connected to each GOA unit are turned on and turned off simultaneously. In the high resolution region, a phase of SW2 changes so that there is a phase difference between SW1 and SW2 (with a phase difference of 180 degrees). At this time, two gate lines connected to each GOA unit are turned on and turned off in turn. output1 and output2 are output signals of the GOA unit 1 and the GOA unit 2 respectively. By taking output1 as an example, a duration of a high level of output1 is 2T and a duration of a high level of SW1 is T. As shown in FIG. 2, a first high level of SW1 corresponds to a first T of a high level of output1, and therefore, in the first T, Gate1 is at a high level, and in a latter T, SW1 is at a low level. At this time, the control switch is turned off, Gate1 remains at a high level, and when SW1 becomes a high level again, the control switch is turned on and Gate1 is decreased to a low level.

Figure 3:
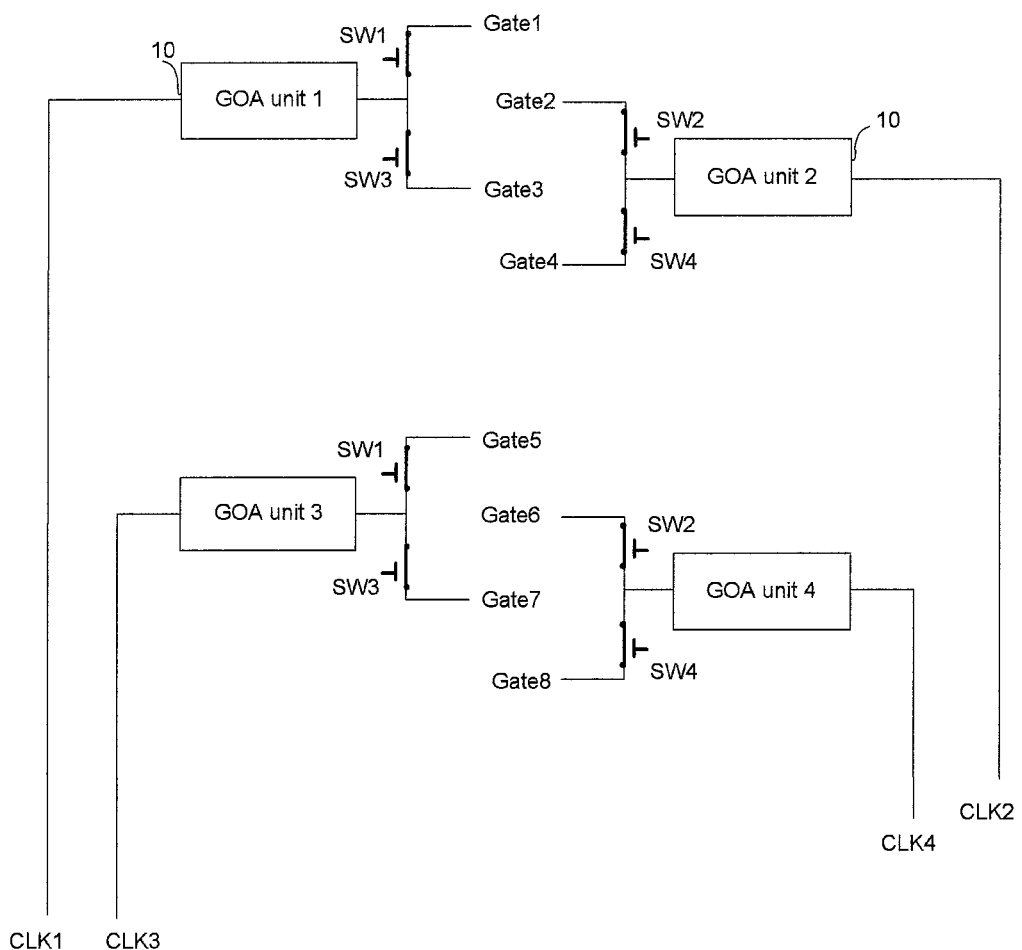
FIG. 3 is a structural diagram of another shift register according to an embodiment of the present disclosure.

In another implementation of the embodiments of the present disclosure, all the gate lines in each group of gate lines are not adjacent to each other in the scanning order. As shown in FIG. 3, each group of gate lines comprises two gate lines (for example, Gate1 and Gate2), and the two gate lines are not provided adjacent to each other in the scanning order. The controller provides four clock signals, i.e., CLK1-CLK4, wherein CLK1 is output to the GOA unit 1, CLK2 is output to the GOA unit 2, CLK3 is output to the GOA unit 3, and CLK4 is output to the GOA unit 4. Of course, the four CLKs are only used by way of example. In practical applications, there may also be more or less CLKs.

In the embodiment shown in FIG. 3, the GOA unit 1 and the GOA unit 3 are first shift register units, and the GOA unit 2 and the GOA unit 4 are second shift register units. The first shift register units and the second shift register units are arranged on opposing sides of a display area. The plurality of shift register units are provided on opposing sides of the display area, which avoids a border of the display panel from being too large due to arrangement of the plurality of shift register units on the same side.

As shown in FIG. 3, the control switches are divided into four groups, one of which is a plurality of control switches SW1 on the left side, one of which is a plurality of control switches SW3 on the left side, one of which is a plurality of control switches SW2 on the right side, and one of which is a plurality of control switches SW4 on the right side. The four groups of control switches are driven by the driving signal shown in FIG. 4.

When all the gate lines in each group of gate lines are not adjacent to each other, the controller is configured to control, in the high resolution region, control switches connected to at least two adjacent gate lines to be turned on and turned off in turn and control the control switches connected to the same shift register unit not to be turned on and turned off simultaneously; and control, in the low resolution region, control switches connected to the gate lines which are turned on and turned off synchronously to be turned on and turned off simultaneously. In the high resolution region, the control switches connected to various gate lines are controlled to be turned on and turned off one by one, so that various rows of pixels are displayed differently to achieve a high resolution; and in the low resolution region, at least two adjacent gate lines are controlled to be turned on and turned off simultaneously, so that two rows of pixels are displayed in the same manner to achieve a low resolution.

When all the gate lines in each group of gate lines are not adjacent to each other, the controller is further configured to control, in the high resolution region, shift register units connected to various gate lines in the high resolution region to output a signal in turn; and control, in the low resolution region, shift register units connected to the gate lines which are turned on and turned off synchronously to output a signal at the same time. The shift register units connected to the gate lines which are turned on and turned off simultaneously in the low resolution region output a signal at the same time, and the shift register units connected to various rows of gate lines in the high resolution region output a signal in turn, which ensures the realization of high and low resolutions.

An operation of the shift register shown in FIG. 3 will be described in detail below in conjunction with a signal timing diagram shown in FIG. 4.

Figure 4:
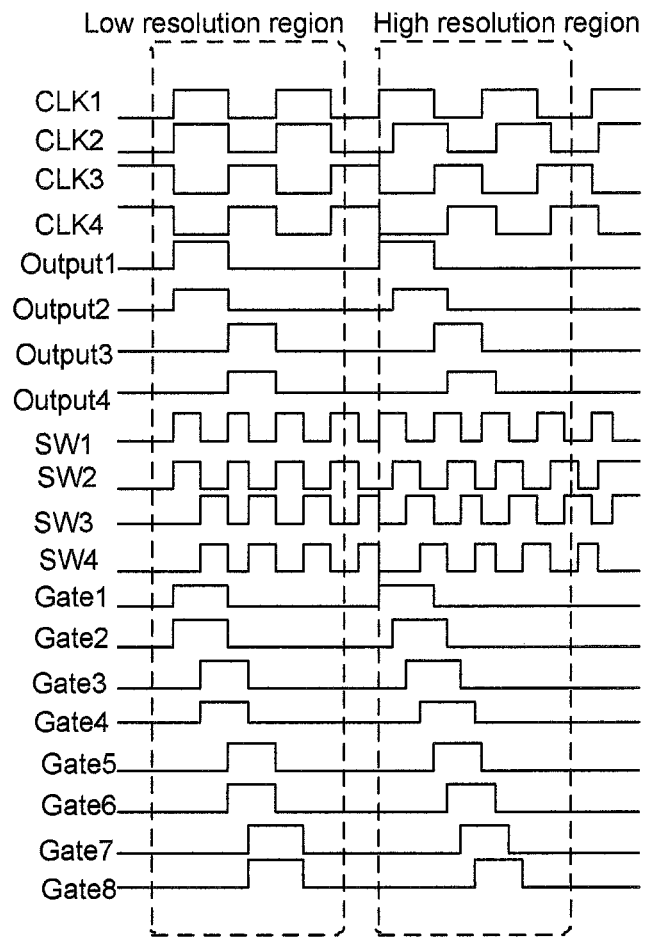
FIG. 4 is another timing control diagram according to an embodiment of the present disclosure.

As shown in FIG. 4, in the low resolution region, CLK1 and CLK2 are in-phase signals, CLK3 and CLK4 are in-phase signals, and CLK1 and CLK3 are inverting signals, and in the high resolution region, there is a phase difference among CLK1-CLK4. In the low resolution region, SW1 and SW2 are in-phase signals, SW3 and SW4 are in-phase signals, and SW1 and SW3 are inverting signals; and in the high resolution region, there is a phase difference among SW1-SW4. In this way, in the high resolution region, various rows of gate lines can be turned on and turned off in order; and in the low resolution region, two consecutive gate lines, for example, Gate1 and Gate2, are turned on and turned off simultaneously. output1-output4 are output signals of the GOA unit 1 to the GOA unit 4, respectively.

As shown in FIGS. 2 and 4, the gate lines in the embodiments of the present disclosure may be turned on and turned off in turn, which may be that one row of gate lines is turned on and then another row of gate lines is turned on, one row of gate lines is turned off and then another row of gate lines is turned off, and there is an overlap between turn-on times of the two rows of gate lines. By taking FIG. 2 as an example, there is a partial overlap between turn-on times of Gate1 and Gate2 in the high resolution region. This overlap realizes pre-charging of Gate2, which ensures good screen display performance.

Figure 5:
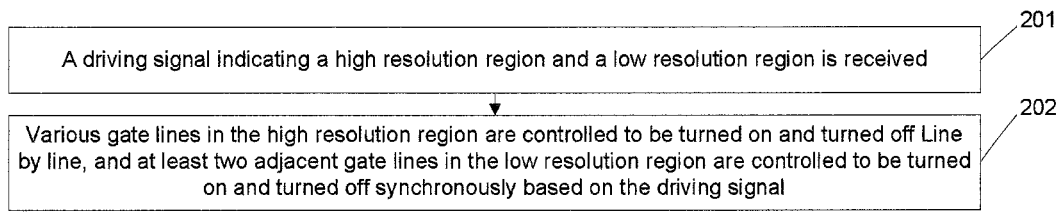
FIG. 5 is a flowchart of gate line driving method according to an embodiment of the present disclosure.

FIG. 5 is a flowchart of a gate line driving method according to an embodiment of the present disclosure. As shown in FIG. 5, the method is implemented by using the shift register described above, and comprises the following steps.

In step 201, a driving signal indicating a high resolution region and a low resolution region of a display area is received.

Specifically, the driving signal indicates the high resolution region and the low resolution region of the display area. The driving signal may be implemented in multiple ways. For example, the driving signal may be a timing signal. The timing signal indicates the high resolution region and the low resolution region through high and low levels. For example, in a scanning process of one frame image, the timing signal comprises a low level segment, a high level segment, and a low level segment which are provided consecutively, and determines a duration and a position of high resolution display in one frame image according to a length and a position of the high level segment in the timing signal to determine the high resolution region and the low resolution region in the display area.

Alternatively, the driving signal may be a resolution switching command. When the resolution switching command is received, a display mode is switched, wherein the display mode may comprise the first display mode and the second display mode described above.

In step 202, various gate lines in the high resolution region are controlled to be turned on and turned off line by line, and at least two adjacent gate lines in the low resolution region are controlled to be turned on and turned off synchronously based on the driving signal.

Controlling the turn-on and turn-off of the gate lines comprises both controlling the control switches and controlling the shift register units, and details thereof can be known with reference to the above description.

The embodiments of the present disclosure further provide an array substrate, comprising the shift register described above.

The embodiments of the present disclosure further provide a display apparatus comprising the array substrate described above.

In a specific implementation, the display apparatus according to the embodiments of the present disclosure may be any product or component having a display function such as a mobile phone, a tablet computer, a television, a display, a notebook computer, a digital photo frame, a navigator, etc.

In the embodiments of the present disclosure, gate lines are controlled to be turned on and turned off line by line in the high resolution region; and at least two adjacent gate lines are controlled to be turned on and turned off synchronously in the low resolution region. In this way, various gate lines in the high resolution region work independently to ensure a high resolution, and at least two gate lines are scanned at the same time in the low resolution region and the same data signal is written to the at least two gate lines by a source driver, which reduces a variation in the gate signal and reduces power consumption of the source driver. Finally, a high resolution display panel may be divided into the high resolution region and the low resolution region, and the overall power consumption of the display panel is reduced through the lower power consumption of the low resolution region, which solves the problem of a drastically increased power consumption of a conventional high resolution display panel due to an increased number of rows to be scanned.

The above description is merely preferred embodiments of the present disclosure and is not intended to limit the present disclosure. Any modifications, equivalent substitutions, and improvements etc. made within the spirit and principle of the present disclosure should be included in the protection scope of the present disclosure.

We claim:

1. A shift register, comprising:
   a plurality of shift register units, each connected to a group of gate lines on an array substrate, wherein the array substrate comprise a plurality of gate lines, the plurality of gate lines are divided into a plurality of groups; each of the plurality of shift register units is connected to each group of plurality of groups respectively, and each group of gate lines comprises at least two gate lines; and a control unit configured to control turn-on and turn-off of the plurality of gate lines, so that a display area is divided into a first low resolution region, a high resolution region, and a second low resolution region along a scanning direction of the gate lines; wherein sizes and positions of the first low resolution region, the high resolution region, and the second low resolution region are determined by using a human eye tracking method;

wherein the control unit is further configured to control various gate lines arranged in a high resolution region to be turned on and turned off line by line and turn-on times of at least part of the gate lines in the high resolution region, are overlapped and control at least two adjacent gate lines arranged in the first low resolution region and the second low resolution region to be turned on and turned off synchronously;

wherein the control unit comprises:
a plurality of control switches arranged in a one-to-one correspondence with the plurality of gate lines, wherein each of the control switches is connected between a corresponding gate line and a corresponding shift register unit;
a controller configured to generate N control signals to control turn-on and turn-off of the plurality of control switches and output of the plurality of shift register units, where N is a positive integer greater than 1; and
N control lines, each of the N control lines configured to transmit one of the N control signals;
wherein the plurality of control switches are divided into N groups, and each group of control switches is connected to the controller via one of the N control lines to receive one of the control signals from the controller; wherein any two of consecutive N gate lines of the plurality of gate lines are connected to control switches belonging to different groups;
wherein the control unit is configured to
output a first control signal and a second control signal different from the first control signal to a first control switches of the plurality of control switches connected to the gate lines arranged in the high resolution region; and output a first control signal and a second control signal the same as the first control signal to a second control switches of the plurality of control switches connected to the gate lines arranged in the first low resolution region and the second low resolution region.

2. The shift register according to claim 1, wherein all the gate lines in each group of gate lines are provided consecutively in a scanning order.

3. The shift register according to claim 2, wherein when all the gate lines in each group of gate lines are provided consecutively in the scanning order, the controller is configured to control the control switches connected to each group of gate lines in the high resolution region to be turned on and turned off in turn, and control the control switches connected to each group of gate lines in the first low resolution region and the second low resolution region to be turned on and turned off simultaneously.

4. The shift register according to claim 3, wherein the controller is further configured to control the plurality of shift register units to output a signal in turn in a scanning order of signal lines.

5. The shift register according to claim 1, wherein the plurality of shift register units comprise a plurality of first shift register units and a plurality of second shift register units, wherein the first shift register units and the second shift register units are arranged on opposing sides of a display area.

6. A gate line driving method performed by the shift register according to claim 1, comprising:
receiving a driving signal indicating a high resolution region, a first low resolution region, and a second low resolution region; and
controlling, based on the driving signal, various gate lines in the high resolution region to be turned on and turned off line by line and controlling at least two adjacent gate lines in the first low resolution region and the second low resolution region to be turned on and turned off synchronously.

7. An array substrate comprising the shift register according to claim 1.

8. A display apparatus comprising the array substrate according to claim 7.

9. The shift register according to claim 1, wherein all the gate lines in each group of gate lines are not provided consecutively in the scanning order.

10. The shift register according to claim 9, wherein when all the gate lines in each group of gate lines are not provided consecutively in the scanning order, the controller is configured to control various gate lines in the high resolution region to be turned on and turned off in turn in the scanning order and control the control switches connected to at least two gate lines in the first low resolution region and the second low resolution region, which are provided consecutively in the scanning order, to be turned on and turned off simultaneously.

11. The shift register according to claim 1, wherein the plurality of shift register units comprise a plurality of first shift register units and a plurality of second shift register units, wherein the first shift register units and the second shift register units are arranged on opposing sides of a display area.

12. A gate line driving method performed by the shift register according to claim 1, comprising:
receiving a driving signal indicating a high resolution region, a first low resolution region, and a second low resolution region; and
controlling, based on the driving signal, various gate lines in the high resolution region to be turned on and turned off line by line and controlling at least two adjacent gate lines in the first low resolution region and the second low resolution region to be turned on and turned off synchronously.

13. A gate line driving method performed by the shift register according to claim 3, comprising:
receiving a driving signal indicating a high resolution region, a first low resolution region and a second low resolution region; and
controlling, based on the driving signal, various gate lines in the high resolution region to be turned on and turned off line by line and controlling at least two adjacent gate lines in the first low resolution region and the second low resolution region to be turned on and turned off synchronously.

14. A display apparatus comprising the array substrate according to claim 1.

15. A display apparatus comprising the array substrate according to claim 1.

* * * * *